United States Patent [19]

Kewley

[11] 4,136,375

[45] Jan. 23, 1979

[54] SHIELD CONNECTION IN PHOTOFLASH ARRAY

[75] Inventor: Norman E. Kewley, Pepper Pike, Ohio

[73] Assignee: General Electric Company, Schenectady, N.Y.

[21] Appl. No.: 837,732

[22] Filed: Sep. 29, 1977

[51] Int. Cl.² ............................................. G03B 15/02
[52] U.S. Cl. .......................................... 362/10; 362/13; 362/247; 362/347
[58] Field of Search .................... 362/10, 11, 13, 247, 362/347

[56] References Cited

U.S. PATENT DOCUMENTS 4,060,721  11/1977  Hanson et al. .................... 362/13

Primary Examiner—Stephen J. Lechert, Jr.
Attorney, Agent, or Firm—Norman C. Fulmer; Lawrence R. Kempton; Frank L. Neuhauser

[57] ABSTRACT

Flash lamp lead-in wires are embedded in a circuit board and are in contact with circuit runs carried by the board. The end of one lead-in wire of at least one of the lamps extends from the circuit board and makes electrical contact against a sheet-like shield member. In a preferred method the lead-in wires of a lamp are driven through the circuit board by ultrasonic drivers offset from each other so as to drive against one lead-in wire closer to its end than is the other.

7 Claims, 8 Drawing Figures

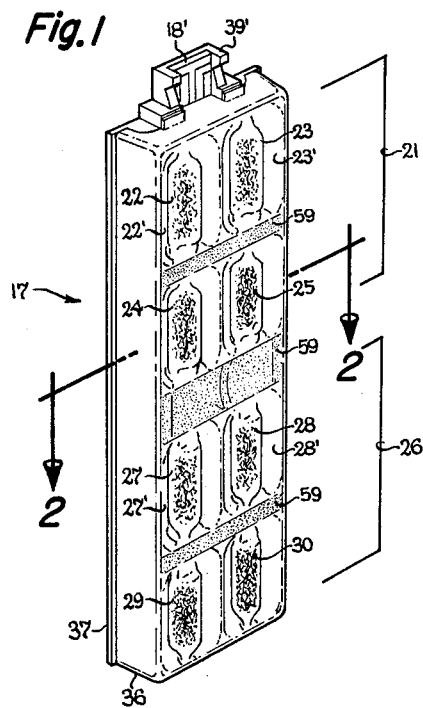
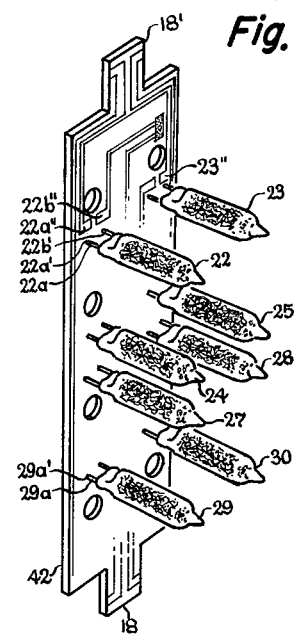
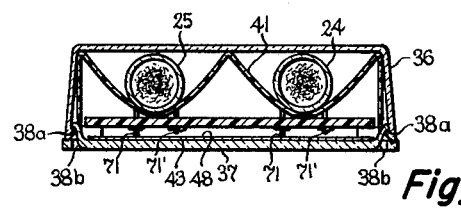
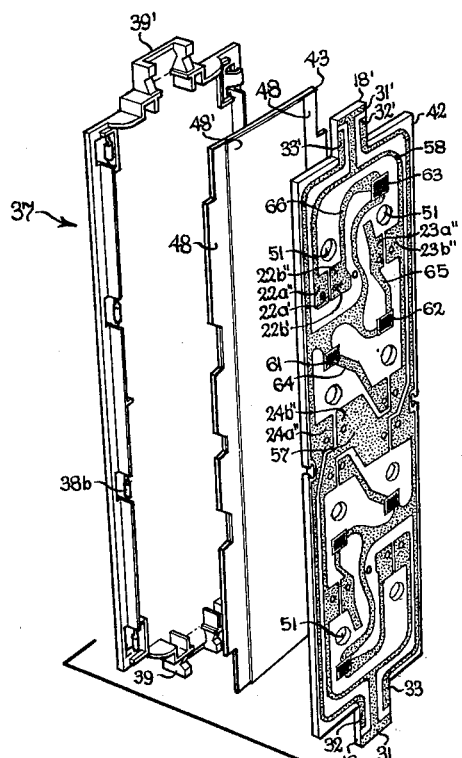
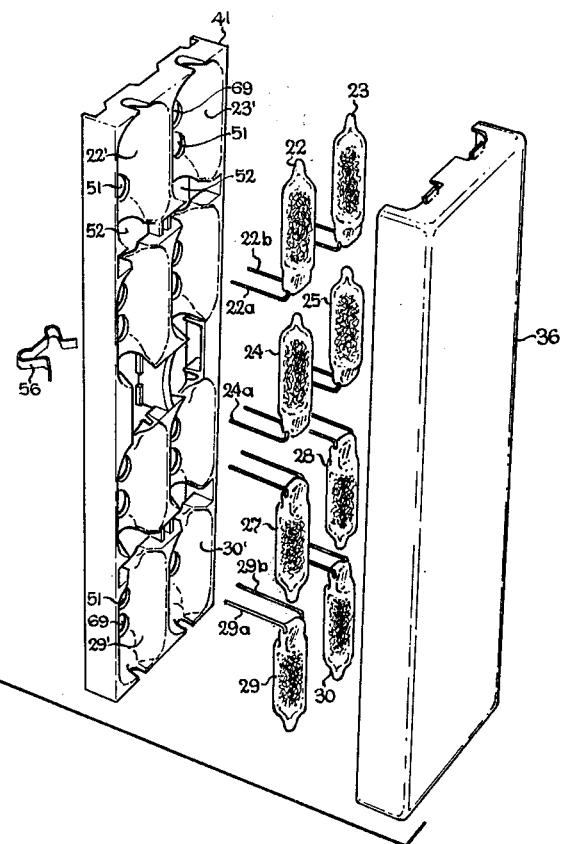

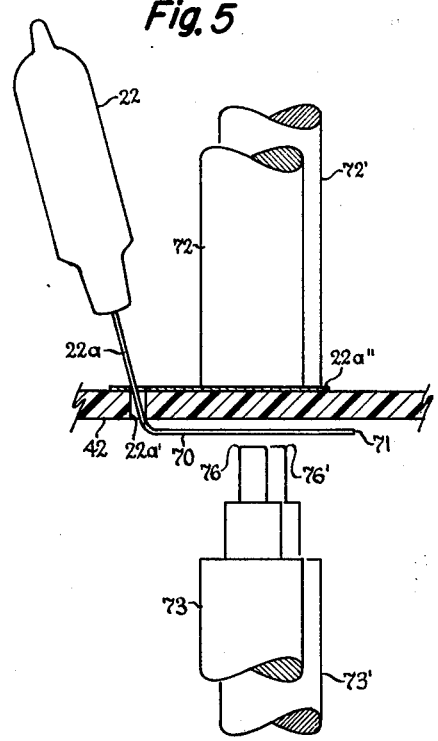
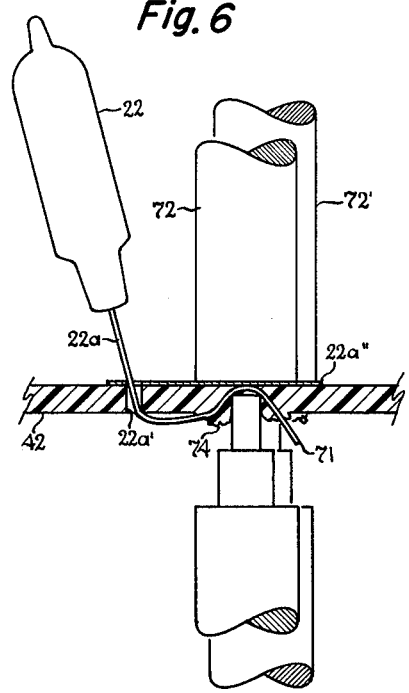
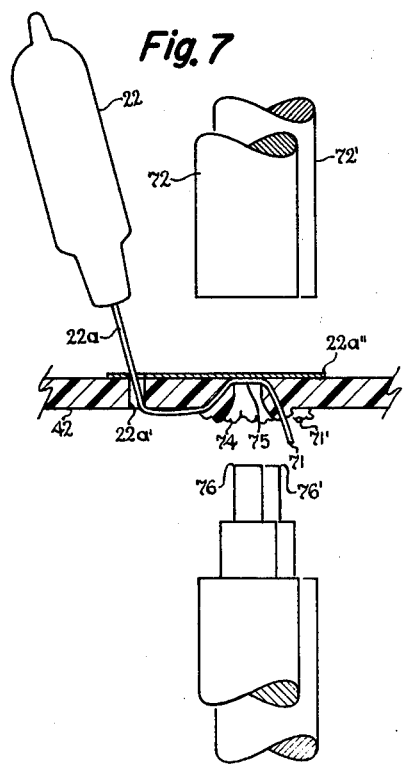
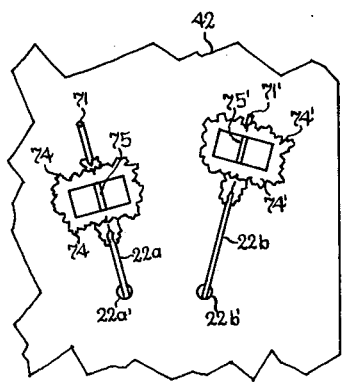

SHIELD CONNECTION IN PHOTOFLASH ARRAY

CROSS-REFERENCE TO RELATED APPLICATION

Ser. No. 805,770, filed June 13, 1977, Levand and Lenkner, "Photoflash Lamp Array Having Shielded Switching Circuit," now U.S. Pat. No. 4,104,705 and assigned the same as the present invention.

BACKGROUND OF THE INVENTION

The invention is in the field of multiple photoflash lamp units, such as planar arrays.

The FlipFlash type of photoflash array, disclosed in U.S. Pat. No. 3,937,946 to Weber, is a multiple flash lamp unit that can be connected to a camera in different orientations in each of which a different group of the flash lamps is relatively farther from the camera lens axis than are the other lamps of the unit. The lamps and electrical circuitry are arranged so that in any of the orientations of the unit with respect to the camera, only the group of lamps relatively farther from the lens axis can be flashed. The purpose of such an arrangement is to position the "active" group of flash lamps farther above the camera lens in order to reduce the possibility of a "red-eye" effect that causes the pupils of a person's eyes to appear red or pink in flash pictures taken when the flash lamp is close to the camera lens.

Such flash units employ high voltage types of flash lamps which are flashed by a high voltage pulse (1000 or 2000 volts, for example) of low energy, and are prone to electrostatic firing of one or more lamps if the flash unit is touched by or brought into close proximity to a person or object having an electrostatic charge. Such undesirable accidental flashing of lamps can also occur if the flash unit housing, which usually is made of a plastic material, acquires an electrostatic charge and a connector terminal is touched by or brought into close proximity to a person or object. The problem can also occur, and can be more severe, if both the plastic housing and the person or object near to or touching a connection terminal are electrostatically charged with relatively opposite polarities.

Various ways have been devised for reducing the likelihood of accidental flashing of lamps by electrostatic charges, for example by providing an electrically conductive shield adjacent to the circuit board and electrically connecting the shield to the common or "ground" electrical part of the circuitry of the circuit board. The shield increases the stray capacitance to surrounding space so that electrostatic charges applied to the flash array tend to dissipate into surrounding space rather than through the flash lamps. U.S. Pat. No. 3,935,442 to Hanson discloses a flash array having a shield in the form of a conductive reflector unit connected to electrical ground of the circuit board. U.S. Pat. No. 3,941,992 to Blount et al. discloses a flash array having an electrically grounded shield adjacent to or on the rear surface of the circuit board. U.S. Pat. No. 4,019,043 to Blount discloses a flash array having a metal foil sheet shield behind the circuit board and electrically grounded by means of eyelets through the circuit board, and the above-referenced patent application discloses a similar arrangement but with a different way of grounding the shield. U.S. Pat. No. 4,036,578 to Herman discloses a flash array having a sheet shield that is electrically grounded by being in contact against bent-over eyelets which pass through the board and connect a lead-in of each flash lamp to electrical ground of the circuit.

SUMMARY OF THE INVENTION

Objects of the invention are to provide an improved flash lamp array, and to provide improved and economical means for preventing accidental electrostatic flashing of lamps in such an array.

The invention comprises, briefly and in a preferred embodiment, a multiple flash lamp array which comprises a lamp flashing circuit in the form of a printed circuit on a surface of a circuit board. An electrically conductive sheet-like shield is provided adjacent and parallel to the other surface of the circuit board to reduce the possibility of accidental flashing of lamps by electrostatic voltage, which flashing tends to occur particularly when high voltage, low energy types of lamps are used in the array. A plurality of electrical terminals are provided on the array for connecting it to a socket of a camera or flash adapter, one of which terminals is shaped and arranged to be relatively more touchable than the others and is electrically connected to the common "ground" of the circuit and to the shield. The common "ground" of the circuit also is connected to a lead-in wire of each lamp, and to a conductive reflector member, in addition to the shield, these members and connections constituting part of the common electrical portion of the circuit and having a relatively large stray capacitance to ground. By thus making one terminal more readily touchable and providing it with a relatively large stray capacitance to ground, an electrostatic charge applied to this terminal will be principally diverted through the larger stray capacitance to ground instead of passing through flash lamps in the array. Also, the shield on the one side and the conductive reflector on the other side of the circuit board shield the lamps from electrostatic charges. The shield preferably is spaced from the rear side of the circuit board to reduce the capacitance between the shield and the non-common electrical portions of the circuit on the front side of the circuit board.

The flash lamp lead-in wires are connected to the circuit board by bending and embedding them sideways into the plastic material of the board so that they contact against various appropriate circuit runs, this being accomplished by ultrasonic or other suitable means, as disclosed in U.S. Pat. No. 4,028,798 to Bechard et al.

In accordance with the present invention, the flash lamp lead-in wires are embedded in the circuit board in a manner such that the end regions of the electrically grounded lead-in wires extend rearwardly from the circuit board and in contact against the metal foil shield, thus connecting the shield to electrical ground and also spacing it away from the back of the circuit board to prevent it from short-circuiting against the remaining (electrically "hot") lead-in wires of the lamps. The foregoing preferably is accomplished with lamps having lead-in wires of the same length, the lead-in of each lamp that is connected to electrical ground being driven into the circuit board at a region farther from its tip than is the other lead-in wire, so that the end regions of the grounded lead-in wires extend a desired distance rearwardly from the board (for contacting the shield) and the remaining lead-in wires extend a shorter distance or not at all (so as not to contact the shield). Alternatively, the lead-in wires that are electrically grounded can be made longer than the other lead-in wires so their end regions will extend relatively farther from the circuit board. Preferably, the shield is a sheet of electrically conductive paper, plastic, or metal foil, or a sheet of conductively coated paper, which may also function as an indicia sheet by carrying indicia such as instructions, flash indicators, information, etc., on its back side.

BRIEF DESCRIPTION OF THE DRAWINGS

FIG. 1 is a perspective view of a multiple flash lamp array embodying the invention.

FIG. 2 is a sectional view taken on the line 2—2 of FIG. 1.

FIG. 3 is an exploded view of the array of FIG. 1.

FIG. 4 is a perspective view of a circuit board having flash lamps attached thereto in accordance with an embodiment of the invention.

FIGS. 5, 6, and 7 illustrate steps in the method of attaching lamp lead-in wires to the circuit board of the embodiment shown in FIG. 4.

FIG. 8 is a view of a portion of the non-circuit side of the circuit board of FIG. 4 showing the flash lamp lead-in wire connections.

DESCRIPTION OF THE PREFERRED EMBODIMENTS

A multiple flash lamp unit 17 of the planar array type and containing a plurality of electrically fired flash lamps is provided with a plug-in connector tab 18 at the lower end thereof, adapted to fit into a socket of a camera or flash adapter as shown and described in patent applications referenced in the above-referenced Hanson patent. The lamp array 17 is provided with a second plug-in connector tab 18' at the top end thereof, whereby the array 17 is adapted to be attached to the camera socket in either of two orientations, i.e., with either the tab 18 or the tab 18' plugged into the socket. The array 17 is provided with an upper group 21 of flash lamps 22, 23, 24, and 25, and a lower group 26 of flash lamps 27, 28, 29, and 30, the lamps being arranged in a planar configuration. Reflectors 22', etc., are disposed behind the respective flash lamps, so that as each lamp is flashed, its light is projected forwardly of the array 17. The lamps are arranged and connected so that when the array is connected to a camera by the connector 18, only the upper group 21 of lamps will be flashed, and when the array is turned end for end and connected to the camera by the other connector 18', only the then upper group 26 of lamps will be flashed. By this arrangement, only lamps relatively far from the lens axis are flashable, thus reducing the undesirable red-eye effect.

The general construction of the arrays comprises front and back housing members 36 and 37, which preferably are made of plastic and are provided with interlocking members 38 which can be molded integrally with the housing members and which lock the housing members together in final assembly to form a unitary flash array structure. Ultrasonic power may also be applied to weld the unitary flash array structure. FIG. 2 shows a pair of interlocking members 38a carried at the rear of the side of the front housing member 36 interlocked with a pair of interlocking members 38b of the back housing member 37. In the preferred embodiment shown, the front housing member 36 is a rectangular concavity and the back housing member 37 is substantially flat and includes integral extensions 39 and 39' at the ends thereof which partly surround and protect the connector tabs 18 and 18' and also function to facilitate mechanical attachment to the camera socket. Sandwiched between the front and back housing members 36 and 37, in the order named, are the flash lamps 22, etc., a unitary reflector member 41 (preferably of aluminum-coated plastic) shaped to provide the individual reflectors 22', etc., a printed circuit board 42 provided with integral connector tabs 18 and 18', and a combination shield and indicia sheet 43 which may be provided with instructions, information, and other indicia such as flash indicators as described in the above-referenced Hanson patent. A conductive material 48 such as aluminum is coated on the entire front surface of the indicia paper sheet 48 and functions as a shield. Openings 51 are provided through the reflector unit 41 and the circuit board 42 to facilitate radiation from flashing lamps reaching a flash indicator sheet 48' which may be provided over the conductive coating 48 and which changes color behind a flashed lamp, as disclosed in the above-referenced Blount patent. The rear housing member 37 is transparent (either of clear material or provided with window openings) to permit viewing of the indicia on the indicia sheet 43. The front housing member 36 is transparent at least in front of the lamps 22, etc., to permit light from flashing lamps to emerge frontwardly to the array, and may be tinted to alter the color of light from the flash lamps.

The height and width of the rectangular array are substantially greater than its thickness, and the heights and widths of the reflector member 41 and circuit board 42 are substantially the same as the interior height and width of the housing member 36, to facilitate holding the parts in place.

The tab 18, which is integral with the circuit board 42, is provided with a pair of electrical terminals 31 and 32, and similarly the tab 18, is provided with a pair of terminals 31' and 31', for contacting terminals of a camera socket for applying firing voltage pulses to the array. Each tab is provided with a third terminal 33 and 33', respectively, which functions to electrically short to electrical ground the circuitry of the inactive lower group of lamps when the array is plugged into a socket. The terminals 31 and 31' are shown as having a lateral "T-bar" configuration for temporarily shorting the socket terminals while the array is being plugged in, to discharge any residual voltage charge in the firing pulse source and also to reduce the likelihood of lamps being accidentally flashed by electrostatic voltage when the array is handled, as is disclosed in U.S. Pat. No. 3,980,876 to Cote.

The circuit board 42 has a "printed circuit" thereon, as will be described, for causing sequential flashing of the lamps by firing voltage pulses applied to the terminals 31, 32 or 31', 32'. The top and bottom halves of the printed circuitry preferably are reverse mirror images of each other. The lead wires 22a, 22b, etc., of the lamps 22, etc., pass through openings 52 in the reflector member 41 and through respective openings 22a', 22b', etc., in the circuit board 42, and are attached to the adjacent circuit run areas 22a'', 22b'', etc., as be described with reference to FIGS. 5-8.

A metal clip 56 can be clipped onto the reflector member 41, which reflector preferably is made of metal-coated plastic, and the rear of the clip 56 rests in touching contact against an area 57 of an electrical ground circuit run 58 on the board and which includes the terminals 31 and 31' and which makes contact with one of the lead-in wires of each of the lamps 22, etc., whereby the reflector unit 41 additionally functions as an electrically grounded shield. The reflector 41 can be connected to electrical ground in various alternative ways.

Areas 59 on the transparent front housing member 36 may be made opaque or partly opaque, such as by making the surface roughened at these areas, to fully or partly conceal the lamp lead-in wires 22a, 22b, etc., and/or the lower portions of the lamps, for improved appearance of the array.

The circuit board terminal 32 is part of a conductor run that is electrically connected to lead-in wire 24a of lamp 24 and terminates at radiation switches 61, 62, and 63 respectively positioned near lamps 24, 25, and 23. A circuit board conductor run 64 is connected electrically to the remaining lead wire of flash lamp 25 and terminates at the radiation switch 61. A circuit board conductor run 65 is connected to the remaining lead-in wire of flash lamp 23 and terminates at the radiation switch 62. Similarly, a circuit board conductor run 66 is connected to the remaining lead-in wire of flash lamp 22 and terminates at radiation switch 63.

The radiation switches 61, 62, and 63 are respectively in contact with and bridge across the circuit runs that are connected to them. The material for the radiation switches may be suitable material initially having an open circuit or high resistance, the resistance thereof becoming zero or a low value when the material receives radiation in the form of heat and/or light from a respective adjacent lamp, upon the lamp being flashed. For this purpose, each of the radiation switches is respectively positioned behind and near to a flash lamp 24, 25, 23. Windows in the form of transparent sections or openings 69 may be provided in the reflectors in front of the switches as shown in FIG. 3 to facilitate radiation transfer. A suitable material for the radiation switches is silver oxide, silver carbonate, or a mixture of both dispersed in a binder such as polyvinyl resin. Another suitable radiation switch material is disclosed in U.S. Pat. No. 3,990,832 to Smialek et al. Each of these radiation switches, upon receiving heat and/or light radiation from the adjacent lamp when it is flashed, changes from an open circuit or high resistance to a closed circuit or low resistance between its switch terminals on the circuit board.

As has been explained, the lower portion of the circuit board contains a substantially reverse mirror image of the same circuit shown in the upper part of the circuit board, and therefore will not be described in detail.

The circuit on the circuit board 42 functions as follows. Assuming that none of the four lamps in the upper half of the unit 17 have been flashed, upon occurrence of a first firing pulse applied across the terminals 31, 32, this pulse will be directly applied to the lead-in wires of the first-connected flash lamp 24, whereupon the lamp 24 flashes and becomes an open circuit between its lead-in wires. Heat and/or light radiation from the flashing first lamp 24 causes the adjacent radiation switch 61 to become a closed circuit (or a low value of resistance), thereby connecting the circuit board terminal 32 electrically to the lead-in wire of the second lamp 25 at eyelet 25a'. By the time this occurs, the firing pulse has diminished to a value insufficient to cause the second lamp 25 to flash. When the next firing pulse occurs, it is applied to the lead-in wires of the second lamp 25, via the now closed radiation switch 61, whereupon the second lamp 25 flashes, thereby causing radiation switch 62 to assume zero or low resistance, and the second lamp 25 now has an open circuit or high resistance between its lead-in wires. When the next firing pulse occurs, it is applied via now closed radiation switch 62 to the third lamp 23, thereby firing the lamp which becomes an open circuit, and the radiation from it causes the radiation switch 63 to become essentially a closed circuit across its terminals. Thus, the next firing pulse will be applied, via now closed radiation switch 63, to the lead-in wires of the fourth flash lamp 22, thereupon causing the lamp to flash. Since this lamp is the last lamp in the active circuit, it does not matter whether its lead-in wires are an open or closed circuit after flashing. Additional flash lamps, radiation switches, and electrical conductors can be employed, if desired, using the just described principles. When the flash unit is turned around and the other connector tab 18' attached to the camera socket, the group of lamps that then become uppermost and relatively farthest away from the lens axis will be in an active circuit and will be flashed in the same manner as has been described. In a preferred embodiment, the lamps 22, etc., are high voltage types, requiring about 1000 volts for example, at low current, for flashing, and they can be fired by impacting or stressing a piezoelectric element in the camera.

In accordance with the present invention, the lead-in wires of the flash lamps are attached to the circuit board so as to make electrical contact with the appropriate circuit runs and so that the electrically grounded lead-in wires are bent so as to extend rearwardly from the circuit board and made electrical contact against the shield sheet 48. In one embodiment of the invention, shown in FIGS. 4–8, the assembly of flash lamps 22, 23, etc., and circuit board 42 is made by the method of providing pairs of openings 22a', 22b', etc., through the circuit board 42 at or adjacent to the pairs of circuit run areas 22a'', 22b'', etc., to which the pairs of lamp lead-in wires 22a, 22b, etc., are to be connected. FIGS. 5, 6, and 7 show the steps of attaching a lamp 22 to the circuit board 42, the rest of the lamps being similarly attached simultaneously with lamp 22, or one or more lamps may be attached at a time. The lead-in wires 22a and 22b of lamp 22 are inserted through the openings 22a' and 22b' in the circuit board from the side of the board carrying the circuit run connection areas 22a'' and 22b'', as shown in FIG. 5 and regions 70 of the lead-in wires are positioned alongside the other side of the circuit board in alignment with the connection areas 22a'' and 22b'' as illustrated in FIG. 5. One or more anvils 72, 72' or other suitable support means are positioned against the circuit board connection areas 22a'', 22b'', etc. (or, vice versa, the circuit board is positioned against the anvils), and a pair of wire-embedding tools 73, 73' are moved to force and drive at least a portion of the wire regions 70 into the board 42 and against the undersides of the connection areas 22a'', 22b'', etc., as shown in FIG. 6, and to cause the material of the board 42 to flow around at least part of the regions 70 of the wires so as to mechanically hold the wires and keep them in electrical contact with the circuit board connection areas. During this wire-driving step, the wires become bent so that their ends or tips 71, 71', etc., extend toward on or out from the rear surface of the circuit board. FIGS. 6, 7, and 8 shown the ridges 74 of board material (plastic, for example) which have been created by a flowing of the material due to penetration of the tool 73 and which surround and embed the wires. Thus, secure and reliable electrical and mechanical connections are made between the wires and the circuit board.

The embedding tools 73, etc., can be ultrasonic vibrating tools, ultrasonic vibrating techniques being well known, for example as described in the above-referenced Bechard et al patent. The correct depth of penetration of the tool 73 into the board 42 can be measured and determined by force, pressure, time and/or distance, etc. The tool 73 can be heated in addition to, or in lieu of, vibrating in order to cause the board material to flow and hold the wires in electrical contact with the circuit board conductors. The conductor contact areas can be carried by the board in different ways; they need not be on a surface of the board; they can be embedded or contained within the board. The edges 76 of the embedding tool 73 preferably are rounded slightly so as not to cut through the embedded wire regions 70. The embedding end of the tool 73 may have a rectangular cross section as indicated in FIG. 8, or square, circular, or other suitable shape. The wire end regions 70 extend beyond opposed edges of the end of the tools 73, as shown, so that they become embedded and held at two places, i.e., at opposed sides or edges of the opening formed by the tool in the plastic. The embedding end, or driving surface, of the tools 73, etc., preferably are substantially flat as shown so as to form the wire into an elongated straight portion 75 which engages against the circuit board conductor over a finite length as shown in FIG. 7, thus increasing the area and reliability of electrical contact. Separate individual driving tools 73, etc., can be employed for embedding several wires simultaneously, or a single tool can be provided with a plurality of driving heads or shanks for simultaneously embedding a plurality of wires into the board.

Further in accordance with the preferred embodiment of the invention, the pair of lead-in wires of each lamp extend equal lengths externally of the lamp base, and the embedding tools 73 and 73' for each pair of wires are offset from one another so that the lead-in wire of each lamp that is connected to electrical ground (lead-in wire 22a of lamp 22, for example) is driven into the circuit board at a location closer to the lamp than is the other lead-in wire and such that the end of the grounded lead-in wire of at least one lamp, and preferably of all the lamps, extends rearwardly of the circuit board to make electrical ground contact against the shield member 48, whereas the other lead-in wire of each lamp does not extend rearwardly of the circuit board (or extends rearwardly from the board a shorter distance than the ground lead-in wire) so that it will not contact the shield and cause the lamps to be short-circuited. If the shield 48 is coated with the plastic flash indicator material 48', the ends of the ground lead-in wires readily pierce the plastic material 48' and make contact against the shield 48. It is not necessary that the ends of all of the ground lead-in wires contact the shield 48, as adequate grounding of the shield 48 is obtained if it is contacted by one or more of the ground lead-in wires. FIGS. 2, 7, and 8 in particular show how the offset positioning of the embedding tools 73, 73' causes the end region of the ground-connected lead-in wire 71 of a lamp to extend rearwardly of the circuit board so as to make contact against the shield sheet 48 whereas the ends 71' of the other lead-in wires do not contact the shield 48. Thus, the invention achieves, in a single manufacturing step, the attachment and connections of the lamp lead-in wires and also the electrical grounding of the shield 48 (which occurs when the parts are assembled together).

Instead of the offset positioning of the embedment regions of the lead-in wires for causing the electrically grounded wires to extend relatively farther behind the circuit board so as to contact against the shield, the pairs of wires can be embedded equal distances from the circuit board openings 22a', 22b', etc., if the electrically grounded wires are made longer than the other wires before attachment, or if the wires are equal in length and embedded so that both wires extend to the rear of the circuit board and then the non-grounded wire ends are clipped off or bent over. However, these alternatives add costly steps to the manufacturing process. Another alternative is to drive the end regions of the lead-in wires perpendicularly through the circuit runs, the ends of the grounded wires extending from the back of the circuit board and in contact against the shield 48.

While preferred embodiments and modifications of the invention have been shown and described, various other embodiments and modifications thereof will become apparent to persons skilled in the art, and will fall within the scope of the invention as defined in the following claims.

What I claim as new and desire to secure by U.S. Letters Patent is:

1. A multiple flash lamp array comprising a plurality of flash lamps each having a pair of lead-in wires extending therefrom, a circuit board, circuitry comprising circuit runs carried by said circuit board for sequentially firing said lamps, and a sheet-like conductive shield member positioned substantially parallel to one side of said circuit board, said lead-in wires of the lamps being embedded in said circuit board and in contact with respective ones of said circuit runs, the end of one lead-in wire of at least one of said pairs thereof extending from said side of the circuit board and in contact against said shield member.

2. An array as claimed in claim 1, including flash indicator material positioned on the surface of said shield member which faces toward said circuit board, and in which said ends of the lead-in wires that are in contact against the shield member penetrate through said flash indicator material.

3. An array as claimed in claim 1, in which said circuitry comprises a common circuit run carried by said circuit board and constituting electrical ground of said circuitry, one lead-in wire of each lamp being embedded in said circuit board and in contact against said common circuit run, the ends of a plurality of said last-mentioned lead-in wires extending from said side of the circuit board and toward said shield member, one or more of said extending lead-in wire ends being in contact against said shield member.

4. An array as claimed in claim 1, in which said lamps are positioned over the other side of said circuit board, and in which said lead-in wires of the lamps extend through holes provided through the circuit board, each pair of said extending lead-in wires lying along said one side of the circuit board in substantially side-by-side parallelism, the wires of each pair thereof being embedded in said circuit board in an offset manner so that a first one of them is embedded at a point farther from its end than is the second wire of the pair, whereby the ends of said first wires extend farther from said one side of the circuit board than do the ends of said second wires, so that one or more of said first wire ends are in contact against said shield member and none of said second wire ends are in contact against said shield member.

5. An array as claimed in claim 4, in which said circuitry comprises a common circuit run carried by said circuit board and constituting electrical ground of said circuitry, one lead-in wire of each pair thereof being embedded in said circuit board in contact against said common circuit run.

6. An array as claimed in claim 5, in which said array comprises a plurality of connector terminals arranged so that one of them is more readily touched than the others when the array is handled, and means electrically connecting said common circuit run to said terminal that is more readily touched.

7. An array as claimed in claim 6, including flash indicator material positioned on the surface of said shield member which faces toward said circuit board, and in which said ends of the lead-in wires that are in contact against the shield member penetrate through said flash indicator material.

* * * * *